United States Patent [19]

Nguyen et al.

[11] Patent Number: 5,858,592
[45] Date of Patent: Jan. 12, 1999

[54] TERPOLYMERS USEFUL AS CHARGE INJECTION BARRIER MATERIALS FOR PHOTORECEPTOR

[75] Inventors: Khe C. Nguyen, Los Altos; Sivapackia Ganapathiappan, Mountain View, both of Calif.

[73] Assignee: Hewlett-Packard Company, Palo Alto, Calif.

[21] Appl. No.: 873,966

[22] Filed: Jun. 12, 1997

Related U.S. Application Data

[63] Continuation-in-part of Ser. No. 498,614, Jul. 6, 1995, abandoned.

[51] Int. Cl.⁶ ........................................................ G03G 5/14
[52] U.S. Cl. .............................. 430/58; 430/56; 430/64; 430/66; 430/67; 430/96; 430/131; 430/132
[58] Field of Search ................... 430/64, 66, 67, 430/96, 131, 132, 56, 58, 80

[56] References Cited

U.S. PATENT DOCUMENTS

| | | | |
|---|---|---|---|
| 3,887,369 | 6/1975 | Matsuno et al. | 430/64 |
| 4,082,551 | 4/1978 | Steklenski et al. | 428/420 |
| 4,578,334 | 3/1986 | Borsenberger et al. | 430/59 |
| 4,927,727 | 5/1990 | Rimai et al. | 430/99 |
| 4,948,687 | 8/1990 | Murase et al. | 430/58 |
| 4,968,578 | 11/1990 | Light et al. | 430/126 |
| 5,037,718 | 8/1991 | Light et al. | 430/126 |
| 5,284,731 | 2/1994 | Tyagi et al. | 430/126 |

FOREIGN PATENT DOCUMENTS

| | | | |
|---|---|---|---|
| 448780 | 10/1991 | European Pat. Off. | 430/64 |
| 3013-958 | 1/1991 | Japan | 430/96 |

OTHER PUBLICATIONS

Grant et al, eds. *Grant & Hackh's Chemical Dictionary*, Fifth Edition, McGraw-Hill Book Co., NY (1987), p. 298.

*Primary Examiner*—Janis L. Dote

[57] ABSTRACT

A thin (<5 μm) charge injection barrier layer is provided on a top surface of an inverse dual layer photoconductor using hole transport or on at least one surface of a single layer photoconductor or on an electrically conductive substrate of a conventional dual layer photoconductor using either hole transport or electron transport. The charge injection barrier layer comprises at least one terpolymer given by the formula $[A_xB_yC_z]_n$, where A is a charge injection prohibitor to prevent leakage of charge from the surface, B is a solubility control moiety to control solubility of the polymer and its glass transition temperature, and C is an electron charge moiety for neutralizing surface charge. Each of the moieties A, B, and C contain a vinyl group. The value of x is at least about 0.01, y is within the range of about 0.01 to 0.3, and z is within the range of about 0.01 to 0.4, with the sum of x+y+z=1. The value of n is sufficient to provide the polymer with a molecular weight (weight average basis) in the range of about 1,000 to 1,500,000. The charge injection barrier employing these terpolymers (1) stops the charge injection from the surface and stabilizes the dark decay and the charge acceptance of the device; (2) allows an electron transfer/transport from the charge generation layer to the surface in order to effectively neutralize the surface charge while avoiding the charge build-up with repeat cycle due to electron trapping; and (3) controls the polymer chain movement phenomena associated with the solubility and the glass transition temperature $T_g$.

23 Claims, 1 Drawing Sheet

TERPOLYMERS USEFUL AS CHARGE INJECTION BARRIER MATERIALS FOR PHOTORECEPTOR

CROSS-REFERENCE TO RELATED APPLICATION

The present application is a continuation-in-part of application Ser. No. 08/498,614, filed Jul. 6, 1995 now abandoned.

TECHNICAL FIELD

The present invention relates generally to image transfer technology and, more particularly, to electrophotographic photoreceptors.

BACKGROUND ART

Electrophotographic (EP) laser printing employs a toner containing pigment components and thermoplastic components for transferring a toner image formed on selected areas of the surface of an insulating, photoconducting material to an image receiver, such as plain paper, coated paper, transparent substrate (conducting or insulative), or an intermediate transfer medium.

There is a demand in the laser printer industry for multi-colored images. The image quality can be enhanced by a large number of approaches, including the technique which utilizes small particle developer including dry toner having an average particle size less than 5 $\mu$m; see, e.g., U.S. Pat. Nos. 4,927,727; 4,968,578; 5,037,718; and 5,284,731. However, it has also been known that the electrophotographic dry toner having particle size less than 1 $\mu$m is very hard to prepare due to increased specific area, and consequently, liquid toner has become one of the solutions for practical preparation of sub-micrometer xerographic developer.

Liquid toners comprise pigment components and thermoplastic components dispersed in a liquid carrier medium, usually special hydrocarbon liquids. With liquid toners, it has been discovered that the basic printing color (yellow, magenta, cyan, and black) may be applied sequentially to a photoconductor surface, and from there to a sheet of paper or intermediate transfer medium to produce a multi-colored image.

The organic photoconductor products in the market today, generally speaking, are dual layer organic photoconductors (OPCs), which comprise a charge generation layer (CGL) and a charge transport layer (CTL) as key components. In addition to these layers, the photoconductor body can be undercoated or overcoated with other materials to improve adhesion to the substrate or to improve surface wear resistance or to reduce the surface adhesion for improved image transfer efficiency. The OPC with an additional undercoating layer or overcoating layer becomes an organic photoreceptor (OPR) and ready for use in various designs of electrophotographic systems.

Most of the multilayer OPRs in the market are negative charging OPCs in which a thick hole transport hole layer is located on the top of a thin CGL. This is called the standard, or conventional, dual layer OPC. In the conventional case, the CGL usually comprises a photoconductive pigment or dye dispersed in an inert binder, with a pigment/dye content ranging up to about 90 wt %. However, 100% pigment in the CGL is possible where the pigment CGL is vacuum-evaporated in the format of a thin film; see, e.g., U.S. Pat. No. 4,578,334. Besides dispersion stabilizing functions, the CGL binder also plays an important role of adhesion. The conventional dual layer OPC can also be a positive charging OPC when an electron transport is employed.

Positive charging OPCs are also known, either as a single layer structure in which the photoconductive pigment is simply dispersed in a binder matrix or as a thick CGL located on top of the thin CTL. In the case of a positive (+) photoreceptor based on the so-called inverse composite structure, the charge generation elements in the CGL comprise, for example, pigments, dyes, and charge transport molecules. The charge transport layer is based on holes as the carriers.

The conventional dual photoreceptor for electrophotography, in general, exhibits an anomalously high dark decay when the charge generation layer is deposited directly on the metallic substrate, especially aluminum, no matter whether the deposition process is an organic coating process or a vacuum sublimation process. This phenomenon is very prominent when a large contact between the charge generation molecule and substrate metal occurs due to increased amount of charge generation molecule in the CGL or due to the increased thickness of the CGL. This phenomenon happens with most known charge generation molecules, including pigments (poly aromatic pigments including dibromo anthanthrone, perylene, poly azo pigments including bis-, tris-, tetrakis-azo pigments, phthalocyanine pigments, pyrollo-pyrole pigments, and the like), dyes (cyanine dyes, pyrilium dyes, squarylium dyes, and the like), and polymeric charge generation molecules (poly phenylene vinylidene, polyvinyl carbazole, with and without dopant, and the like). This phenomenon is believed to be associated with a charge injection from the substrate metal into the charge generation molecule through the direct contact between these two components; the more contact, the higher the dark decay.

The positive charging photoreceptor for electrophotography, in general, exhibits an increased dark decay and decreased charge acceptance with repeat cycles. This phenomenon is very prominent when a corona-charging system is used and expected to be associated with the positive corona ion charge injected from the surface.

In the case of a positive photoreceptor based on the inverse composite structure, the surface charge injection is believed to involve any or all of the pigment, dye, or hole transport molecule components in the CGL.

Thus, there is a need to minimize the charge injection into the CGL from the metal electrode (conventional dual photoreceptor) or from the free surface (inverse dual photoreceptor).

DISCLOSURE OF INVENTION

In accordance with the invention, a thin (<5 $\mu$m) barrier layer is provided on a top surface of an inverse dual layer photoconductor using hole transport or on at least one surface of a single layer photoconductor or on an electrically conductive substrate of a conventional dual layer photoconductor using either hole transport or electron transport. The thin barrier layer, called a charge injection barrier layer, comprises a terpolymer given by the formula $[A_xB_yC_z]_n$, where A, B, and C are monomeric units and where A is a charge injection prohibitor to prevent leakage of charge from the surface or from an interface between the electrically conductive substrate and the charge generation layer, B is a solubility control moiety to control solubility of the polymer and its glass transition temperature, and C is an electron charge transfer moiety for neutralizing surface charge/interface charge.

Advantageously, A, B, and C all contain vinyl groups. The value of x is at least about 0.01, y is at least about 0.1, and z ranges from about 0.01 to 0.3, with the sum of x+y+z=1 (in terms of weight ratio). The maximum value of y is about 0.3, while the maximum value of z is about 0.4. The value of n in the above formula is sufficient to provide a molecular weight (weight average basis) of about 1,000 to 1,500,000.

The charge injection barrier of the present invention (1) stops the charge injection from surface or from the metal substrate and stabilizes the dark decay and the charge acceptance of the device; (2) allows an electron transfer/transport from the CGL to the metal substrate or to the surface in order to effectively neutralize the surface or interface charge while avoiding the charge build-up with repeat cycle due to electron or hole trapping; and (3) controls the polymer chain movement phenomena associated with the solubility and the glass transition temperature $T_g$.

BEST MODES FOR CARRYING OUT THE INVENTION

Figures 1, 2A:
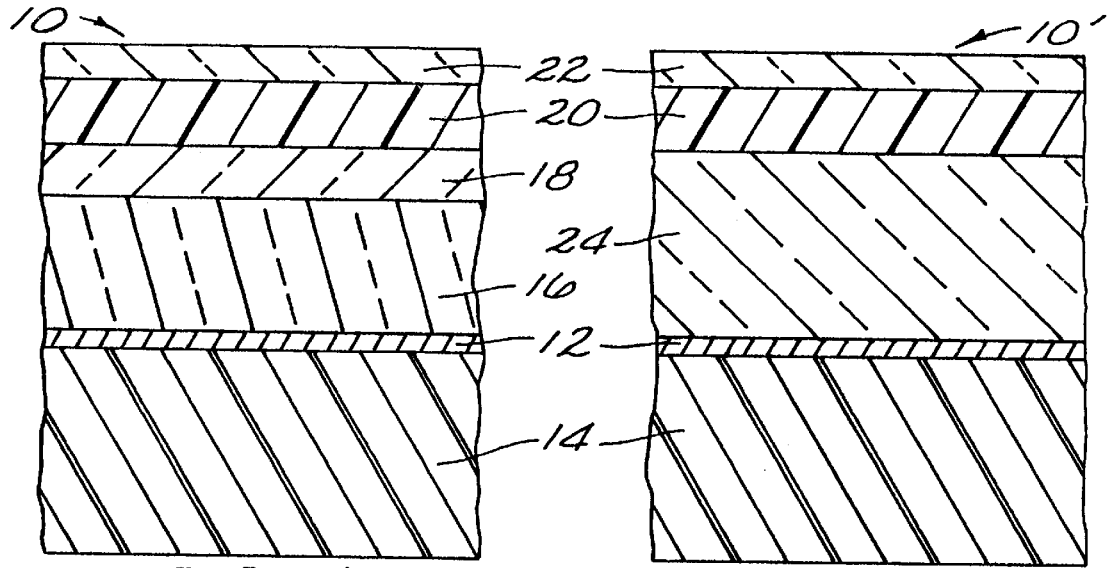
FIG. 1 is a cross-sectional view depicting the configuration of an inverted dual layer positive (+) photoreceptor.
FIG. 2a is a cross-sectional view depicting the configuration of a single layer positive (+) photoreceptor in which the charge injection barrier layer is disposed on the top surface thereof.

Referring now to the drawings, where like numerals of reference designate like elements throughout, FIG. 1 depicts the configuration of an inverted dual layer positive photoreceptor 10, comprising an electrically conductive electrode 12 formed on a support 14. As an example, the support 14 may be a web (e.g., a drum) or subbing layer to improve adhesion to an underlying web (not shown), while the conductive electrode 12 commonly comprises aluminum. A hole transport layer 16 is formed on the conductive electrode 12. A charge generation layer 18 is formed on the hole transport layer 16. A charge injection barrier layer 20, employing materials in accordance with the present invention, is formed on the charge generation layer 18. A top coat 22 is formed on top of the charge injection barrier 20.

FIG. 2a depicts the configuration of a single layer positive photoreceptor 10'. The elements are the same as shown in FIG. 1, except that a single layer photoconductor layer 24 combines the functions of the hole transport layer and the charge generation layer. The charge injection barrier layer 20 is disposed on top of the single layer photoconductor 24.

Figures 2B, 2C:
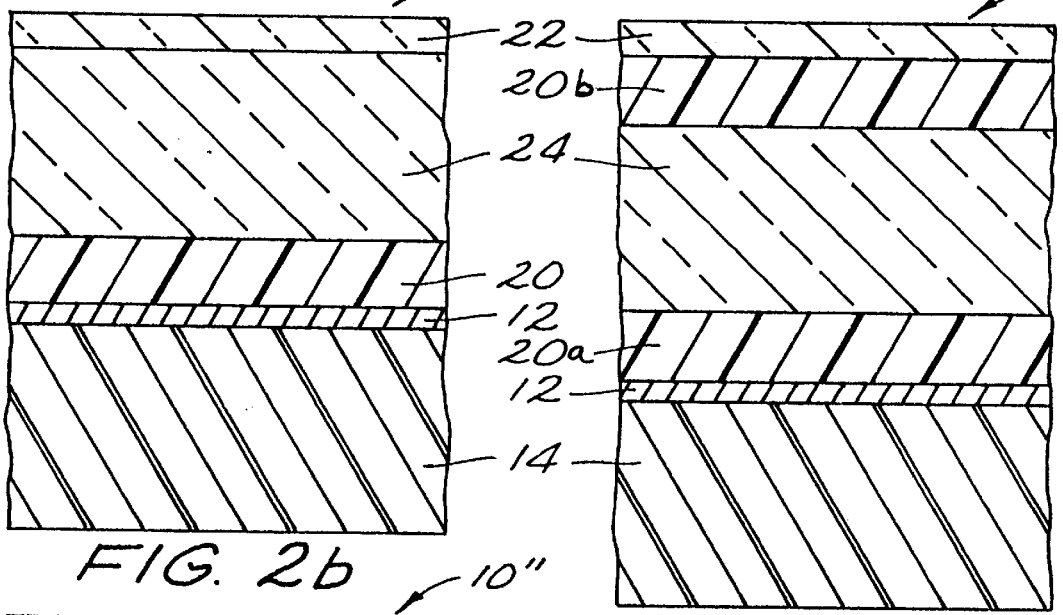
FIG. 2b is a cross-sectional view depicting the configuration of a single layer positive (+) photoreceptor in which the charge injection barrier layer is disposed between the metal substrate and the photoreceptor.
FIG. 2c is a cross-sectional view depicting the configuration of a single layer positive (+) photoreceptor in which two charge injection barrier layers are provided, one disposed between the metal substrate and the photoreceptor and one disposed on top of the photoreceptor.

FIG. 2b depicts a configuration similar to that shown in FIG. 2a, except that the charge injection barrier layer 20 is sandwiched between the conductive electrode 12 and the single layer photoconductor 24.

FIG. 2c depicts a configuration that combines both FIGS. 2a and 2b in that two charge injection barrier layers, 20a, 20b are employed, one (20a) sandwiched between the conductive electrode 12 and the single layer photoconductor 24 and one (20b) disposed on top of the single layer photoconductor.

Figure 3:
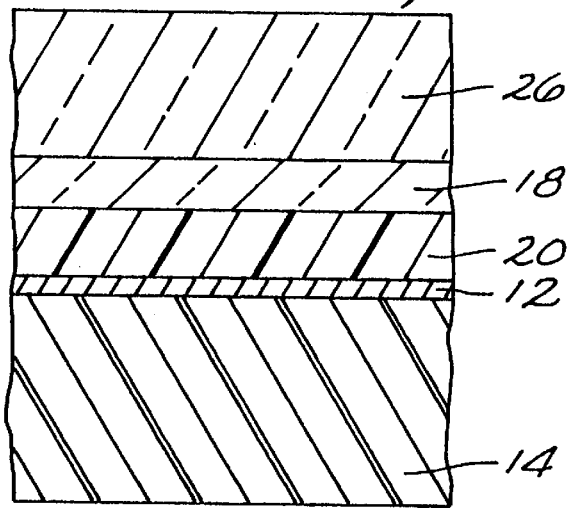
FIG. 3 is a cross-sectional view depicting the configuration of a conventional dual layer photoreceptor, either positive (+) or negative (−).

FIG. 3 depicts the configuration of a conventional dual layer photoreceptor 10" where the charge injection barrier 20 can be used. If electron transport is employed in the charge transport layer 26, then the photoreceptor becomes activated with positive charging. If hole transport is employed in the charge transport layer 26, then the photoreceptor becomes activated with negative charging.

For an organic photoconductor (OPC), the charge generation layer (CGL) commonly comprises a photoconductive pigment or dye dispersed in a binder. Examples of suitable photoconductive pigment and dye molecules (charge generation molecules) include:

(a) the metastable form of phthalocyanine pigments: x-form, tau-form of metal-free phthalocyanine pigment (x-$H_2$Pc), alpha-, epsilon-, beta-form of copper phthalocyanine pigment (CuPc), titanyl phthalocyanine pigments (TiOPcX$_4$, where X is H, F, Cl, Br, I), vanadyl phthalocyanine pigment (VOPc), magnesium phthalocyanine pigment (MgPc), zinc phthalocyanine pigment (ZnPc), chloroindium phthalocyanine pigment (ClInPc), bromoindium phthalocyanine pigment (BrInPc), chloroaluminum phthalocyanine pigment (ClAlPc), hydroxy gallium phthalocyanine pigment, and the like;

(b) pyrollo pyrole pigments;

(c) tetracarboximide perylene pigments;

(d) anthanthrone pigments;

(e) bis-azo, -trisazo, and -tetrakisazo pigments;

(f) zinc oxide pigment;

(g) cadmium sulfide pigment;

(h) hexagonal selenium;

(i) squarylium dyes; and (j) pyrilium dyes.

Examples of suitable binders for the charge generation molecules described above include polystyrenes, polysilanes, polycarbonates, polyimides, polysilanes, polygermanes, polyesters, polyvinyl butyral (PVB), and other such materials well-known in this art. Additional suitable binders include thermoset and thermoplastic polymers having a large degree of flexibility in the polymer conformation due to its flexible backbone, and having a glass transition temperature lower than about 120° C., as disclosed in co-pending application Ser. No. 08/287,437, filed Aug. 8, 1994, entitled "Reusable Inverse Composite Dual-Layer Organic Photoconductor Using Specific Polymers Available for Diffusion Coating Process with Non-Chlorinated Solvents" by Khe C. Nguyen et al and assigned to the same assignee as the present application. These additional binders comprise specific vinyl polymers.

Hole transport agents typically comprise any of the conventional hole transport molecules, including, but not limited to, triaryl methanes, triarylamines, hydrozones, pyrazolines, oxadiazoles, styryl derivatives, carbazolyl derivatives, and thiophene derivatives.

The electron injection inhibitor of the present invention is also useful in combination with inorganic positive charging photoconductors, including, but not limited to, Se and $As_2Se_3$.

Transport molecules can be used in the transport layer 26 of the conventional dual layer photoreceptor 10". For hole transport molecules, any of the well-known hole transport molecules may be used, including, but not limited to, aryl amines and derivatives thereof, hydrazones, pyrazolines, triphenyl methanes, carbozoles and derivatives thereof, polysilanes, polygermanes, oxadiazoles, benzotriazoles, and the like. For electron transport molecules, any of the well-known electron transport molecules may be used, including, but not limited to, dibenzoquinone, trinitrofluorenones and derivatives thereof, diphenyl sulfone, and the like.

1. Basic Concepts

The present invention provides a solution for minimizing the surface charge or interface charge injected by a charge injection barrier material based on the functional design of a terpolymer, given by the formula $[A_xB_yC_z]_n$. The terpolymer for this purpose is designed to contain three basic functions:

A: Charge injection prohibitor monomer unit;
B: Polymer chain movement controlling monomer unit;
C: Electron-transferring monomer unit.

The charge injection prohibitor monomer unit stops the charge injection from the surface or from the conductive substrate to stabilize the dark decay and the charge acceptance of the device. The optional polymer chain movement controlling monomer unit allows an electron transfer/transport from the charge generation layer (CGL) to the surface in order to effectively neutralize the surface charge, avoiding the charge build-up with repeat cycle due to electron trapping. The electron-transferring monomer unit controls the polymer chain movement phenomena associated with the solubility and the glass transition temperature $T_g$. In many cases, the positive inverse dual-layer photoreceptors require a final top coating. So, the charge injection barrier layer must be chemically stable against the top coating to protect the photoconductor body from poisoning.

In the above formula, the value of x is at least about 0.01, the value of y ranges from about 0.01 to 0.3 and preferably to about 0.2, and the value of z ranges from about 0.01 to 0.4, with the sum of x+y+z=1 (in terms of weight ratio). As used herein, the term "terpolymer" refers to polymers comprising the three monomer unit (A-B-C). The value of n in the above formula is sufficient to provide the polymer with a molecular weight (weight average basis) of about 1,000 to 1,500,000.

As used herein, the values of x, y, and z are given in terms of weight ratio, and the molecular weight is given in terms of weight average basis.

A single terpolymer may be employed as the charge injection barrier layer. Alternatively, a blend of two or more terpolymers may be employed in order to tailor the specific properties desired.

2. Chemistry of the Charge Injection Barrier

A. Examples of A, B, and C monomer units:

The A monomer unit is selected from vinyl monomer carrying amines and amides such as >N—, >NH, and —NH$_2$. Examples of the positive charge injection prohibitor monomer units are:

a. vinyl pyridines

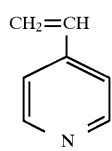

b. N-vinyl pyrrolidones

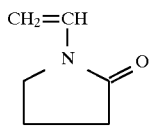

c. diethylamino styrenes

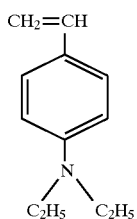

d. N,N-diethylmethacrylamides

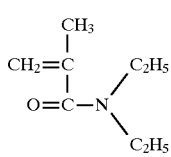

e. N,N-diethylaminoethylmethacrylate

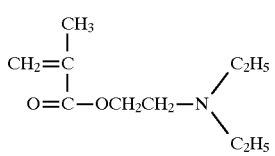

f. vinylimidazole

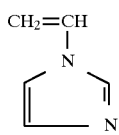

g. N-vinyl carbazole

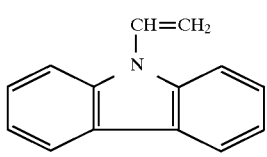

h. acrylamide

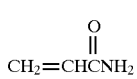

i. N,N-dimethylaminoethylmethacrylate

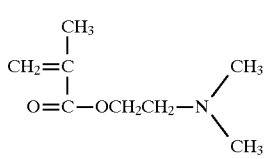

The B monomer unit is selected from the vinyl derivatives, styrene derivatives and vinyl fluorides such as:

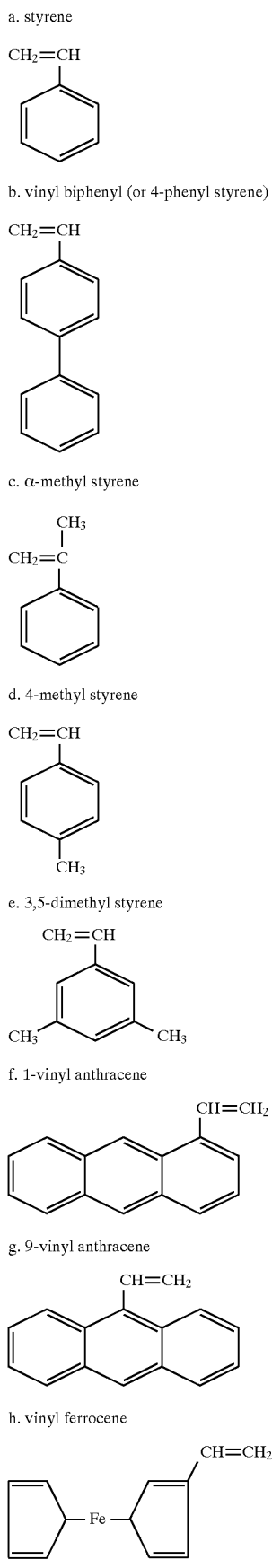

a. styrene
b. vinyl biphenyl (or 4-phenyl styrene)
c. α-methyl styrene
d. 4-methyl styrene
e. 3,5-dimethyl styrene
f. 1-vinyl anthracene
g. 9-vinyl anthracene
h. vinyl ferrocene

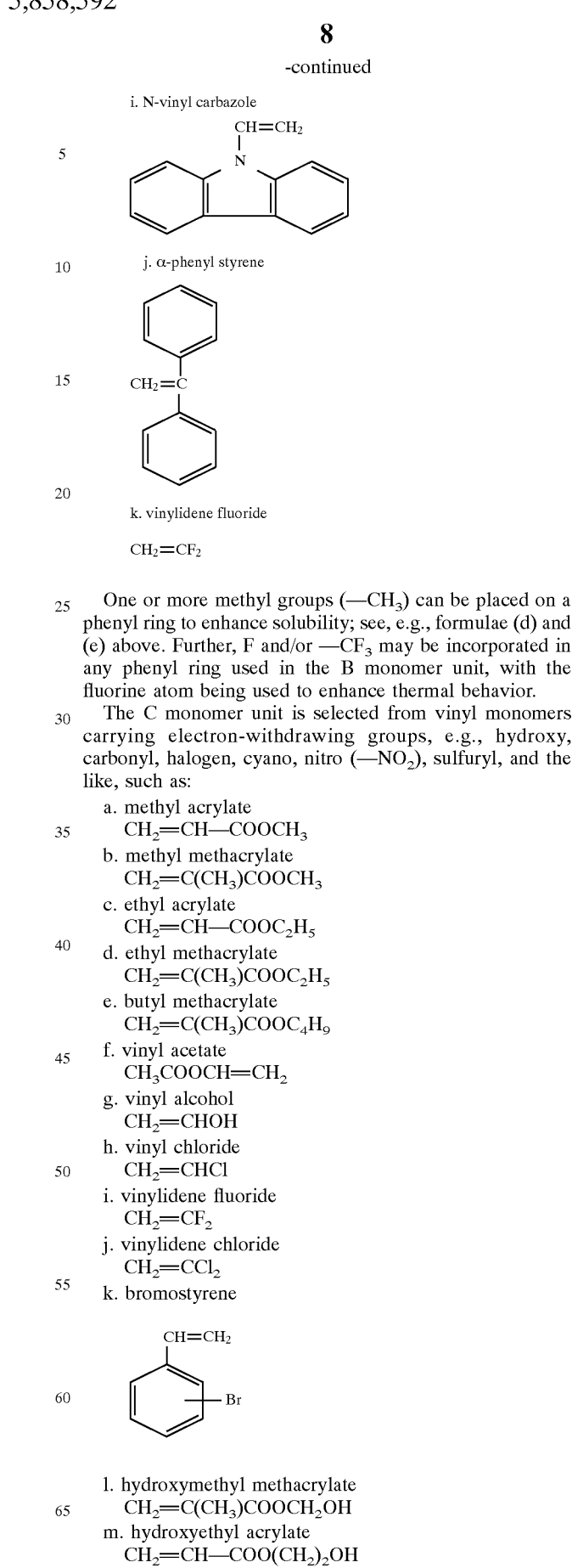

-continued i. N-vinyl carbazole j. α-phenyl styrene k. vinylidene fluoride
$CH_2{=}CF_2$ One or more methyl groups ($—CH_3$) can be placed on a phenyl ring to enhance solubility; see, e.g., formulae (d) and (e) above. Further, F and/or $—CF_3$ may be incorporated in any phenyl ring used in the B monomer unit, with the fluorine atom being used to enhance thermal behavior.

The C monomer unit is selected from vinyl monomers carrying electron-withdrawing groups, e.g., hydroxy, carbonyl, halogen, cyano, nitro ($—NO_2$), sulfuryl, and the like, such as:

a. methyl acrylate
   $CH_2{=}CH—COOCH_3$
b. methyl methacrylate
   $CH_2{=}C(CH_3)COOCH_3$
c. ethyl acrylate
   $CH_2{=}CH—COOC_2H_5$
d. ethyl methacrylate
   $CH_2{=}C(CH_3)COOC_2H_5$
e. butyl methacrylate
   $CH_2{=}C(CH_3)COOC_4H_9$
f. vinyl acetate
   $CH_3COOCH{=}CH_2$
g. vinyl alcohol
   $CH_2{=}CHOH$
h. vinyl chloride
   $CH_2{=}CHCl$
i. vinylidene fluoride
   $CH_2{=}CF_2$
j. vinylidene chloride
   $CH_2{=}CCl_2$
k. bromostyrene l. hydroxymethyl methacrylate
   $CH_2{=}C(CH_3)COOCH_2OH$
m. hydroxyethyl acrylate
   $CH_2{=}CH—COO(CH_2)_2OH$ n. hydroxyethyl methacrylate
   $CH_2=C(CH_3)COO(CH_2)_2OH$
o. hydroxyethyl acrylamide
   $CH_2=CHCONH(CH_2)_2OH$
p. hydroxyethyl methacrylamide
   $CH_2=C(CH_3)CONH(CH_2)_2OH$
q. allyl alcohols of the formula
   $CH_2=C(R)CH_2OH$, where R is H or $CH_3$
r. allyl alcohols of the formula
   $CH_2=C(R_1)-O-R_2-CH_2OH$, where $R_1$ is H or $CH_3$ and $R_2$ is $(CH_2)_m$ and where m is an integer from 0 to 10.
s. vinyl alcohols of the formula
   $CH_2=C(R)OH$, where R is H or $CH_3$.

The above-listed formulae are shown in terms of a specific isomer. However, it will be appreciated by those skilled in this art that any of the isomers of a given compound, if more than one isomer exists, may be suitably employed in the practice of the present invention.

B. Synthesis Methods:

The terpolymers of the present invention are advantageously formed by thermal polyaddition of vinyl monomers. This procedure is well-known in the prior art. Specifically, the mixture of suitable vinyl monomers is stirred in an inert atmosphere, such as nitrogen, with an initiator, such as aza bis-iso-butyronitrile (AIBN), at a temperature of at least about 80° C. for several hours, for example, 80 hours. Purification of the terpolymer is accomplished by precipitation from a known solvent, such as an alcohol, using a non-solvent, such as water or heptane, as the precipitating agent. The alcohol solvent is a low molecular weight alcohol comprising 1 to 4 carbon atoms, such as methyl alcohol, ethyl alcohol, or iso-propyl alcohol. The temperature must be at least about 80° C. in order to control the molecular weight of the polymer, which is not as readily controllable below this temperature.

The terpolymers of the present invention can be prepared as either thermoplastics or thermosets. Thermoset terpolymers are prepared using one of the hydroxy-containing monomers listed above (such as hydroxy ethyl acrylate, hydroxy methyl methacrylate, etc.) as the C unit and adding a suitable crosslinker, such as an iso-cyanate, a melamine, an epoxy, a dialdehyde, or a phenolic resin. The amount of crosslinker added is related to the amount of C and is approximately the same as the value of z. The crosslinker is incorporated in the structure of the crosslinked polymer.

C. Working Examples:

Examples of terpolymers, comprising A-B-C monomer units, suitably employed in the practice of the present invention include the following:

1. poly[vinyl pyridine/vinyl biphenyl/vinyl acetate]

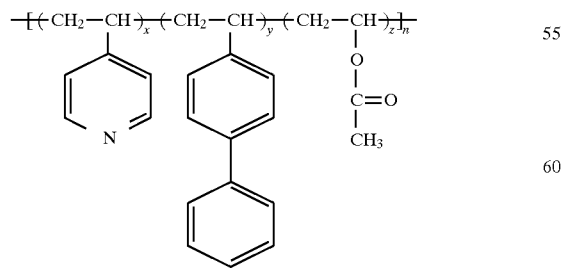

Examples of the foregoing polymer include the following:
x=0.60, y=0.20, z=0.20;
x=0.60, y=0.10, z=0.30;
x=0.50, y=0.10, z=0.40.

The value of n in this polymer, as in all the polymers of the invention, is sufficient to provide a molecular weight of about 1,000 to 1,500,000.

2. poly[N,N-diethylmethacrylamide/vinyl biphenyl/vinyl acetate]

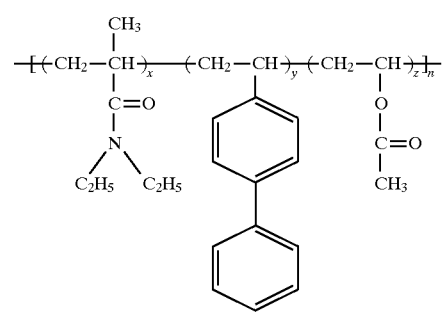

3. poly[vinyl pyrrolidone/vinyl biphenyl/vinyl acetate]

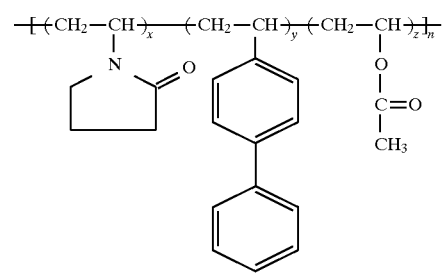

4. poly[diethylaminostyrene/vinyl biphenyl/vinyl acetate]

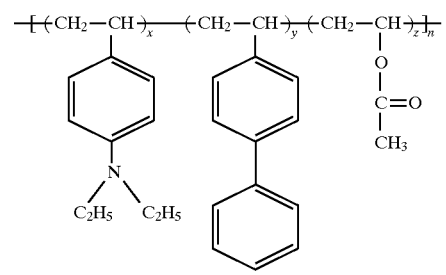

5. poly[vinyl pyridine/α-methylstyrene/vinyl acetate]

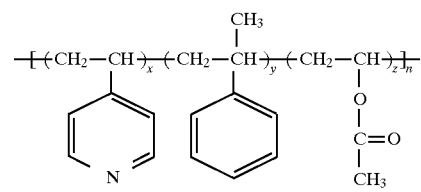

6. poly[vinyl pyridine/vinyl biphenyl/hydroxyethyl acrylate]

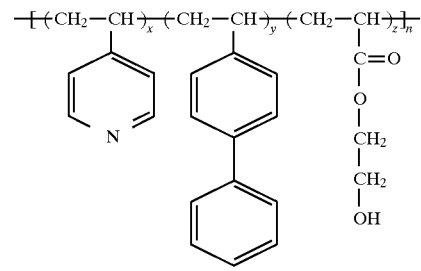

As an example, x=0.7, y=0.1, and z=0.2.

7. poly[vinyl pyridine/vinyl biphenyl/hydroxyethyl acrylamide]

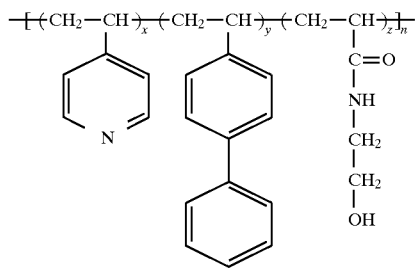

As an example, x=0.7, y=0.2, and z=0.1.

The foregoing examples show specific isomers of the respective compounds in certain cases, although the name is given generically. This is to reflect the fact that any of the other isomers of such compounds may alternatively be employed in the practice of the present invention.

3. Characteristics

All of the terpolymers of the invention examples exhibit high solubility in alcohols and poor solubility in solvents such as tetrahydrofuran (THF), dichloromethane (DCM), and the like.

The barrier layer comprising a solution of the terpolymer of the present invention in a solvent is coated on the top of the CGL to a thickness of about 5 μm or less and dried in oven at an elevated temperature for a period of time. Preferably, the solution of the terpolymer is dried at a temperature in the range of 60° C. to 200° C. for a period of time of about 5 min. to 2 hrs. The solvent comprises a low molecular weight alcohol selected from the group consisting of alcohols having from 1 to 4 carbon atoms. Preferably, the thickness of the barrier layer is at least about 0.01 μm and less than about 1 μm. An example of drying temperature and drying time is 80° C. for 20 minutes.

The barrier exhibits excellent charge stability and excellent charging/photo-discharging characteristics.

EXAMPLES

Example 1

15 g of x-form metal-free phthalocyanine (x-H2Pc), 85 g of polycarbonate (Makrolon, Mobay Chemical), and 900 g of tetrahydrofuran (THF) were milled together in a ball mill using stainless steel beads for 48 hours. The suspension was coated on aluminum/mylar using a doctor blade. The coating layer was dried at 80° C. for 2 hours to achieve a coating layer thickness of 15 μm. This coating formed a single layer photoconductor, as described in U.S. Pat. No. 5,320,923.

Next, in order to prepare a charge injection barrier layer, 15 g of the terpolymer poly[(vinyl pyridine)$_x$(vinyl biphenyl)$_y$(vinyl acetate)$_z$], where x=0.60, y=0.20, and z=0.20, was dissolved in 85 g of iso-propanol (IPA). Either 2-vinyl pyridine or 4-vinyl pyridine may be used. The solution was overcoated on the top of the photoconductive layer, above mentioned, using a doctor blade. The coating was dried at 80° C. for 2 hours. The coating thickness was about 0.3 μm.

The top coat was then formed by overcoating a solution of polydimethyl siloxane terminated by the silanol group (Toray-Dow Corning RV 3140) in toluene on top of the charge injection barrier coating. The coating was dried in an oven at 135° C. for 15 minutes.

The complete full construction photoconductor was then incorporated in a prototype laser printer developed at Hewlett-Packard for life test. In this life cycle test procedure, the photoconductor was exposed to corona charger set at a grid voltage $V_g$=+600 V and then exposed successively to the optical printhead synchronized by 780 nm laser scanning system. The system speed was set at 3 inches/second. The surface potential $V_w$ (volts) corresponding to the image background, the dark decay rate (DDR) (V/s), and the discharge potential $V_b$ (volts) corresponding to the image area were detected by a probe meter Trek model. All of these measurements were automatically controlled by computer.

The charge injection effect was detected by comparing the $V_w$ (volts) and DDR at the first cycle and at 100th cycle. The life cycle was also repeated at an elevated temperature set at 60° C. The data are summarized in Tables 1 (measured at 25° C.) and 2 (measured at 60° C.).

Comparison Example 1a

The experiment of Example 1 was repeated, except that the photoconductor was neither overcoated with the charge injection barrier nor with the top coat. The test results are shown in Tables 1 and 2.

Comparison Example 1b

The experiment of Example 1 was repeated, except that the charge injection barrier only was omitted. The test results are shown in Tables 1 and 2.

TABLE 1

| | Measured at 25° C. | | | | | |
|---|---|---|---|---|---|---|
| Example | $V_w$ (volts) (1st cycle) | $V_b$ (volts) (1st cycle) | DDR (V/s) (1st cycle) | $V_w$ (volts) (1000th cycle) | $V_b$ (volts) (1000th cycle) | DDR (V/s) (1000th cycle) |
| Comparison Example 1a | 595.0 | 50.0 | 2.0 | 150.0 | 50.0 | 15.0 |
| Comparison Example 1b | 605.0 | 60.0 | 2.0 | 185.0 | 60.0 | 15.0 |
| Example 1 | 607.0 | 60.0 | 2.5 | 598.0 | 60.0 | 3.2 |

TABLE 2

Measured at 60° C.

| Example | $V_w$ (volts) (1st cycle) | $V_b$ (volts) (1st cycle) | DDR (V/s) (1st cycle) | $V_w$ (volts) (1000th cycle) | $V_b$ (volts) (1000th cycle) | DDR (V/s) (1000th cycle) |
|---|---|---|---|---|---|---|
| Comparison Example 1 a | 498.0 | 45.0 | 6.5 | 80.0 | 30.0 | 18.0 |
| Comparison Example 1b | 550.0 | 45.0 | 55 | 185.0 | 45.0 | 18.0 |
| Example 1 | 600.0 | 45.0 | 3.0 | 595.0 | 42.0 | 4.0 |

Example 2

40 g of p-tolylamine and 60 g of polycarbonate (Makrolon, Mobay Chemical) were dissolved in 900 g of dichloromethane. The solution was coated on Al-coated polyester (Mylar) using a doctor blade. The coating was dried in an oven at 80° C. for 4 hours. The thickness of the coating was about 20 μm. This coating performed as a hole transport layer.

Next, 30 g of x-H2Pc and 15 g of polycarbonate (Makrolon, Mobay Chemical) and 365 g of THF were milled together in a ball mill using stainless steel beads as milling media for 48 hours. The coating solution was diluted to 5% wt and coated on the top of the above-mentioned hole transport layer. This coating formed a charge generation layer which exhibited a thickness of 0.8 μm after being dried at 80° C. for 2 hours.

Next, a charge injection barrier composed of the terpolymer poly[(vinyl pyridine)$_x$(vinyl biphenyl)$_y$(vinyl acetate)$_z$], where x=0.6, y=0.1, and z=0.3, was deposited on the top of the CGL by the same procedure described in Example 1. As in Example 1, either 2-vinyl pyridine or 4-vinyl pyridine may be used.

Next, the top coat was completed by the same formulation described in Example 1. The full construction photoreceptor was tested in the same way described in Example 1. The test results are illustrated in Tables 3 and 4.

Comparison Example 2a

The experiment described in Example 2 was repeated, except that the photoconductor was not overcoated either with the charge injection barrier layer or with the top coat.

Comparison Example 2b

The experiment described in Example 2 was repeated, except that the inverted dual layer photoconductor was overcoated only with top coat but not with barrier layer.

Comparison Example 2c

The experiment described in Example 2 was repeated, except that the charge injection barrier layer was coated with polyvinyl pyridine instead of the terpolymer. It resulted in a very high $V_b$=150 volts, right in the first cycle.

Comparison Example 2d

The experiment described in Example 2 was repeated, except that polyvinyl acetate was used as charge injection barrier material. It resulted a DDR=20V/s after 1000 cycles. This reveals that the PVAc only does not work as an effective charge injection barrier.

TABLE 3

MEASURED AT 25° C.

| Example | $V_w$ (volts) (1st cycle) | $V_b$ (volts) (1st cycle) | DDR (V/s) (1st cycle) | $V_w$ (volts) (1000th cycle) | $V_b$ (volts) (1000th cycle) | DDR (V/s) (1000th cycle) |
|---|---|---|---|---|---|---|
| Comparison Example 2a | 500.0 | 50.0 | 4.0 | 130.0 | 50.0 | 15.0 |
| Comparison Example 2b | 615.0 | 60.0 | 2.5 | 170.0 | 60.o | 17.0 |
| Example 2 | 601.0 | 60.0 | 2.3 | 598.0 | 60.0 | 2.9 |

TABLE 4

MEASURED AT 60° C.

| Example | $V_w$ (volts) (1st cycle) | $V_b$ (volts) (1st cycle) | DDR (V/s) (1st cycle) | $V_w$ (volts) (1000th cycle) | $V_b$ (volts) (1000th cycle) | DDR (V/s) (1000th cycle) |
|---|---|---|---|---|---|---|
| Comparison | 400.0 | 35.0 | 8.5 | 80.0 | 30.0 | 25.0 |

TABLE 4-continued

MEASURED AT 60° C.

| Example | $V_w$ (volts) (1st cycle) | $V_b$ (volts) (1st cycle) | DDR (V/s) (1st cycle) | $V_w$ (volts) (1000th cycle) | $V_b$ (volts) (1000th cycle) | DDR (V/s) (1000th cycle) |
|---|---|---|---|---|---|---|
| Example 2a Comparison Example 2b | 450.0 | 45.0 | 6.5 | 185.0 | 45.0 | 20.0 |
| Example 2 | 599.0 | 45.0 | 4.0 | 590 | 42.0 | 5.0 |

From these results, it is observed that the charge injection barrier using the terpolymer of the present invention can increase the charge retention ability of the photoreceptor by preventing the positive charge injection from the surface in both room and elevated temperatures.

Example 3

25 g of terpolymer (vinyl pyridine)$_{0.7}$(styrene)$_{0.1}$ (hydroxyethyl acrylate)$_{0.2}$ and 5 g of poly iso-cyanate (Desmondur N-75, Mobay Chemical) were dissolved in 925 g iso-propanol. The solution was coated on an Al/mylar substrate using a doctor blade to achieve a thickness of 0.7 μm after being dried in an oven at 100° C. for 1 hr. This layer comprised the charge injection barrier layer.

Next, 30 g of titanyl phthalocyanine (TiOPc) was milled together with 15 g of poly vinyl butyral (Aldrich Chemical) in 450 g THF using stainless steel beads (5 mm diameter) for 72 hrs using a ball mill to achieve a suspension. The solution was coated on the top of the above-mentioned charge injection barrier layer using a doctor blade to achieve a coating thickness of 1 μm after being dried in an oven at 100° C. for 1 hr. This layer comprised the charge generation layer.

Next, the charge transport layer described in Example 2 was prepared and coated on the top of the above-mentioned charge generation layer in the same manner as described in Example 2. The photoconductor was exposed to the performance test utilized in Example 1. In this case, the photoreceptor was charged with a corona charger set at a grid voltage $V_g$= –800 V and then exposed successively to the optical print head synchronized by a 780 nm laser scanning system. The surface potential $V_w$ (volts) was detected to be –796 V with a dark decay rate of 2.0 V/sec and a residual voltage of –10 V.

Comparison Example 3a

Example 3 was repeated except that the charge injection barrier layer coating was eliminated. The surface potential $V_w$ in this case was detected to be –400 V with a dark decay rate of 8.3 V/sec. This comparison example confirms that the charge injection barrier layer does prevent the high dark decay and provide high charge acceptance for the conventional dual negative charging photoreceptor.

Example 4

Example 3 was repeated except that the charge transport was an electron transport molecule with the chemical structure shown below:

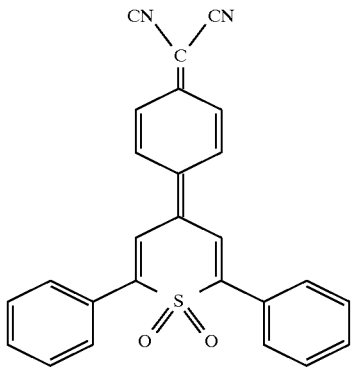

Comparison Example 4a

Example 4 was repeated except that the charge injection barrier coating layer was eliminated.

Both samples of Example 4 and Comparison Example 4a were exposed to the performance test described in Example 1. The results are illustrated in Table 5.

TABLE 5

| Example | $V_w$ (volts) | Dark Decay Rate (V/sec) | Residual Voltage (V) |
|---|---|---|---|
| Comparison Example 4a | 256 | 10.0 | 9.0 |
| Example 4 | 590 | 3.0 | 8.0 |

These results confirm that the charge injection barrier coating layer does prevent the electron injection from the aluminum electrode to provide higher charge acceptance and slower dark decay. This prevention improves the charge acceptance and charge retention ability of a positive photoreceptor.

INDUSTRIAL APPLICABILITY

The terpolymers used in the practice of the invention are expected to find use as charge injection barriers in electrophotographic applications. The photoreceptor with charge injection barrier in this invention can be used for both liquid toner and dry toner.

Thus, there has been disclosed terpolymers as charge injection barrier materials for use in electrophotographic applications. It will be readily appreciated by those skilled in this art that various changes and modifications of an obvious nature may be made, and all such changes and modifications are considered to fall within the scope of the appended claims.

What is claimed is:

1. A charge injection barrier formed on (a) a top surface of an inverse dual layer photoconductor using hole transport or on (b) at least one surface of a photoconductor layer of a single layer photoconductor, wherein said photoconductor layer has a top surface and a bottom surface, or on (c) an electrically conductive substrate of a dual layer photoconductor which comprises said electrically conductive substrate having thereon in order a charge generation layer and either a hole or electron transport layer, said charge injection barrier comprising at least one terpolymer having the formula $[A_xB_yC_z]_n$, where A, B, and C each represent a monomeric unit, where A contains at least one vinyl group carrying at least one amine or amide group and is a charge injection prohibitor to prevent leakage of charge from said surface of said charge generation layer or from an interface between said electrically conductive substrate and said charge generation layer, B contains at least one vinyl group and is a solubility control moiety to control solubility of said terpolymer and its glass transition temperature, and C contains at least one vinyl group carrying at least one electron-withdrawing group and is an electron charge moiety for neutralizing surface charge, and where the value of x is at least about 0.01, the value of y is within the range of about 0.01 to 0.3, the value of z is within the range of about 0.01 to 0.4, the sum of x+y+z=1.0, in terms of weight ratio, and the value of n is sufficient to provide a molecular weight of about 1,000 to 1,500,000, in terms of weight average.

2. The charge injection barrier of claim 1 wherein monomeric unit B is a vinyl-containing moiety, a styrene-containing moiety, or a vinyl fluoride.

3. The charge injection barrier of claim 2 wherein said at least one amine group is selected from the group consisting of >N—, >NH, and —$NH_2$ and wherein said at least one electron-withdrawing group is selected from the group consisting of hydroxy, carbonyl, halogen, cyano, nitro, and sulfuryl.

4. The charge injection barrier of claim 3 wherein monomeric unit A is selected from the group consisting of vinyl pyridines, N-vinyl pyrrolidones, diethylamino styrenes, N,N-diethylmethacrylamide, N,N-diethylaminoethylmethacrylate, N,N-dimethylaminoethylmethacrylate, vinylimidazole, N-vinyl carbazole, and acrylamide.

5. The charge injection barrier of claim 3 wherein monomeric unit B is selected from the group consisting of styrene, vinyl biphenyl, α-methyl styrene, 4-methyl styrene, 3,5-dimethyl styrene, 1-vinyl anthracene, 9-vinyl anthracene, vinyl ferrocene, N-vinyl carbazole, α-phenyl styrene, and vinylidene fluoride.

6. The charge injection barrier of claim 3 wherein monomeric unit C is selected from the group consisting of methyl acrylate, methyl methacrylate, ethyl acrylate, ethyl methacrylate, butyl methacrylate, vinyl acetate, vinyl alcohol, vinyl chloride, vinylidene fluoride, vinylidene chloride, bromostyrene, hydroxymethyl methacrylate, hydroxyethyl acrylate, hydroxyethyl methacrylate, hydroxyethyl acrylamide, hydroxyethyl methacrylamide, allyl alcohols of the formula $CH_2=C(R)CH_2OH$, where R is H or $CH_3$, allyl alcohols of the formula $CH_2=C(R_1)-O-R_2-CH_2OH$, where $R_1$ is H or $CH_3$ and $R_2$ is $(CH_2)_m$, where m is an integer from 0 to 10, and vinyl alcohols of the formula $CH_2=C(R)OH$, where R is H or $CH_3$.

7. The charge injection barrier of claim 1 wherein said terpolymer is selected from the group consisting of poly [vinyl pyridine/vinyl biphenyl/vinyl acetate], poly[N,N-diethylaminomethacrylamide/vinyl biphenyl/vinyl acetate], poly[vinyl pyrrolidone/vinyl biphenyl/vinyl acetate], poly [diethylaminostyrene/vinyl biphenyl/vinyl acetate], poly [vinyl pyridine/α-methylstyrene/vinyl acetate], poly[vinyl pyridine/vinyl biphenyl/hydroxy ethyl acrylate], and poly [vinyl pyridine/vinyl biphenyl/hydroxyethyl acrylamide].

8. The charge injection barrier of claim 1 wherein said terpolymer is a thermoplastic.

9. The charge injection barrier of claim 1 wherein said terpolymer is a crosslinked thermoset, wherein said C monomer unit of said terpolymer contains a hydroxy group and said crosslinked thermoset includes a crosslinking agent incorporated therein.

10. A method of minimizing surface charge injection in photoreceptors, comprising forming a charge injection barrier layer on (a) a top surface of an inverse dual layer photoconductor using hole transport or on (b) at least one surface of a photoconductor layer of a single layer photoconductor, wherein said photoconductor layer has a top surface and a bottom surface and is formed on an electrically conductive substrate, or on (c) an electrically conductive substrate of a dual layer photoconductor which comprises said electrically conductive substrate having thereon in order a charge generation layer and either a hole or electron transport layer, said charge injection barrier comprising at least one terpolymer having the formula $[A_xB_yC_z]_n$, where A, B, and C each represent a monomeric unit, where A contains at least one vinyl group carrying at least one amine or amide group and is a charge injection prohibitor to prevent leakage of charge from said surface of said charge generation layer or from an interface between said electrically conductive substrate and said charge generation layer, B contains at least one vinyl group and is a solubility control moiety to control solubility of said terpolymer and its glass transition temperature, and C contains at least one vinyl group carrying at least one electron-withdrawing group and is an electron charge moiety for neutralizing surface charge, and where the value of x is at least about 0.01, the value of y is within the range of about 0.01 to 0.3, the value of z is within the range of about 0.01 to 0.4, the sum of x+y+z=1.0, in terms of weight ratio, and the value of n is sufficient to provide a molecular weight of about 1,000 to 1,500,000, in terms of weight average.

11. The method of claim 10 wherein monomeric unit B is a vinyl-containing moiety, a styrene-containing moiety, or a vinyl fluoride.

12. The method of claim 10 wherein said at least one amine group is selected from the group consisting of >N—, >NH, and —$NH_2$ and wherein said at least one electron-withdrawing group is selected from the group consisting of hydroxy, carbonyl, halogen, cyano, nitro, and sulfuryl.

13. The method of claim 12 wherein monomeric unit A is selected from the group consisting of vinyl pyridines, N-vinyl pyrrolidones, diethylamino styrenes diethylmethylacrylamide, N,N-diethylaminoethylmethacrylate, N,N-dimethylaminoethylmethacrylate, vinylimidazole, N-vinyl carbazole, and acrylamide.

14. The method of claim 12 wherein monomeric unit B is selected from the group consisting of styrene, vinyl biphenyl, α-methyl styrene, 4-methyl styrene, 3,5-dimethyl styrene, 1-vinyl anthracene, 9-vinyl anthracene, vinyl ferrocene, N-vinyl carbazole, α-phenyl styrene, and vinylidene fluoride.

15. The method of claim 12 wherein monomeric unit C is selected from the group consisting of methyl methacrylate, ethyl acrylate, ethyl methacrylate, butyl methacrylate, vinyl acetate, vinyl alcohol, vinyl chloride, vinylidene fluoride, vinylidene chloride, bromostyrene, hydroxy methyl methacrylate, hydroxy ethyl acrylate, hydroxy ethyl methacrylate, hydroxy ethyl acrylamide, hydroxy ethyl methacrylamide, allyl alcohols of the formula $CH_2=C(R)CH_2OH$, where R is H or $CH_3$, allyl alcohols of the formula $CH_2=C(R_1)-O-R_2-CH_2OH$, where $R_1$ is H or $CH_3$ and $R_2$ is $(CH_2)_m$, where m is an integer from 0 to 10, and vinyl alcohols of the formula $CH_2=C(R)OH$, where R is H or $CH_3$.

16. The method of claim 10 wherein said terpolymer is selected from the group consisting of poly[vinyl pyridine/vinyl biphenyl/vinyl acetate], poly[N,N-diethylaminomethacrylamide/vinyl biphenyl/vinyl acetate], poly[vinyl pyrrolidone/vinyl biphenyl/vinyl acetate], poly[diethylaminostyrene/vinyl biphenyl/vinyl acetate], poly[vinyl pyridine/α-methylstyrene/vinyl acetate], poly[vinyl pyridine/vinyl biphenyl/hydroxy ethyl acrylate], and poly[vinyl pyridine/vinyl biphenyl/hydroxyethyl acrylamide].

17. The method of claim 10 wherein said charge injection barrier layer is formed to a thickness of a maximum of about 5 µm.

18. The method of claim 17 wherein said charge injection barrier is formed to a thickness within the range of about 0.01 to 1 µm.

19. The method of claim 17 wherein said barrier layer is formed on said top surface of said inverse dual layer photoconductor or on said top surface of said photoconductor layer or on said electrically conductive substrate by coating said top surface or said electrically conductive substrate with a solution of said terpolymer in a solvent and drying at an elevated temperature for a period of time.

20. The method of claim 19 wherein said solvent is a low molecular weight alcohol selected from the group consisting of alcohols having from 1 to 4 carbon atoms.

21. The method of claim 10 wherein said terpolymer is formed by thermal polyaddition of vinyl monomers.

22. The method of claim 21 wherein said terpolymer is formed as a thermoplastic.

23. The method of claim 21 wherein said terpolymer is formed as a crosslinked thermoset by employing as said C monomer of said terpolymer a monomer containing a hydroxy group, adding an amount of a crosslinker, said amount being approximately that of said C monomer unit, and copolymerizing said A, B, and C monomer units with said crosslinker to form said thermoset terpolymer.

* * * * *